(12) United States Patent
Johnson et al.

(10) Patent No.: US 11,392,299 B2
(45) Date of Patent: Jul. 19, 2022

(54) MULTI-PURPOSE SIGNALING FOR A MEMORY SYSTEM

(71) Applicant: Micron Technology, Inc., Boise, ID (US)

(72) Inventors: James Brian Johnson, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/951,700

(22) Filed: Nov. 18, 2020

(65) Prior Publication Data
US 2021/0191627 A1  Jun. 24, 2021

Related U.S. Application Data

(60) Provisional application No. 62/951,798, filed on Dec. 20, 2019.

(51) Int. Cl.
*G06F 3/06*  (2006.01)

(52) U.S. Cl.
CPC .......... *G06F 3/0619* (2013.01); *G06F 3/0625* (2013.01); *G06F 3/0653* (2013.01); *G06F 3/0676* (2013.01); *G06F 3/0679* (2013.01)

(58) Field of Classification Search
CPC .... G06F 3/0619; G06F 3/0625; G06F 3/0653; G06F 3/0676; G06F 3/0679; G06F 3/0634; G06F 3/0671; G06F 3/0626
See application file for complete search history.

(56) References Cited

U.S. PATENT DOCUMENTS

| | | | | |
|---|---|---|---|---|
| 5,668,982 | A * | 9/1997 | Davis | G06F 1/04 713/500 |
| 8,489,837 | B1* | 7/2013 | Lee | G06F 3/0659 711/166 |
| 9,881,656 | B2 | 1/2018 | West et al. | |
| 9,940,984 | B1 | 4/2018 | Hossain et al. | |
| 2003/0156473 | A1* | 8/2003 | Sinclair | G11C 7/20 365/200 |
| 2008/0162853 | A1 | 7/2008 | Bang et al. | |
| 2009/0003420 | A1* | 1/2009 | Wu | H04L 1/1671 375/220 |
| 2014/0241024 | A1 | 8/2014 | Kim et al. | |

(Continued)

OTHER PUBLICATIONS

ISA/KR, International Search Report and Written Opinion of the International Searching Authority, Int'l Appl. No. PCT/US2020/064062, dated Mar. 26, 2021, Korean Intellectual Property Office, Seo-gu, Daejeon, Republic of Korea, 10 pgs.

*Primary Examiner* — Hiep T Nguyen
(74) *Attorney, Agent, or Firm* — Holland & Hart LLP

(57) ABSTRACT

Methods, systems, and devices for multi-purpose signaling for a memory system are described. One or more signal paths of between a host device and a memory device may be configured to support shared pathways between multiple channels and to support multiple functions. For example, a signal path may be configured to communicate a state signal for an initialization sequence of the memory device, an error signal for the memory device to indicate that errors have occurred, or a low-power signal for the host device to request that the memory device enter a low-power mode, or a combination thereof. The signal path may be shared between two or more channels of the memory device.

25 Claims, 11 Drawing Sheets

(56) References Cited

U.S. PATENT DOCUMENTS

| | | |
|---|---|---|
| 2016/0254036 A1 | 9/2016 | Bains et al. |
| 2016/0266838 A1* | 9/2016 | Jung ..................... G06F 9/4416 |
| 2019/0250695 A1* | 8/2019 | Ware ..................... G06F 1/3253 |
| 2020/0020371 A1* | 1/2020 | Fujiwara ................ G11C 7/109 |
| 2021/0350870 A1* | 11/2021 | Ware .................. G11C 29/4401 |

* cited by examiner

| Mode of Operation of the Memory Device | First Mode | Second Mode |
|---|---|---|
| Function(s) of the INIT/ AERR signal path | Clock signal for initialization sequence (host device to memory device) | (1) Error signal (memory device to host device) (2) Low-power signal (host device to memory device |

MULTI-PURPOSE SIGNALING FOR A MEMORY SYSTEM

CROSS REFERENCE

The present application for Patent claims priority to U.S. Provisional Patent Application No. 62/951,798 by Johnson et al., entitled "MULTI-PURPOSE SIGNALING FOR A MEMORY SYSTEM," filed Dec. 20, 2019, which is assigned to the assignee hereof and is expressly incorporated by reference in its entirety.

BACKGROUND

The following relates generally to one or more memory systems and more specifically to multi-purpose signaling for a memory system.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Memory devices are equipped with pins that frequently have dedicated functions and couples the memory device with one or more signal paths. Different types of memory device pins may include address pins, data input/output pins, one or more clock input pins, and control pins. In some cases, increasing the functionality of the memory device may include adding new signal paths. In some examples, adding new signal paths may include changing adopted standards associated with memory devices. Additionally or alternatively, adding new signal paths may require increasing physical memory addresses and/or available space in the memory devices. Thus, increasing the quantity of pins and directing instructions using additional data signal paths could increase power and area requirements for each dedicated channel. In turn, this may decrease the performance and functionality of the memory device.

In accordance with examples as disclosed herein, one or more signal paths of the memory devices may be configured to support shared pathways between multiple channels and to support multiple functions. For example, a signal path may be configured to perform multiple functions such as a state signal for an initialization sequence of the memory device, an error signal for the memory device to communicate that errors have occurred to the host device, or a low-power signal for the host device to request that the memory device enter a low-power mode, or a combination thereof. The signal path may be shared between two or more channels of the memory device. Additionally or alternatively, the signal path of the memory device may be configured to adopt a set of functions. By reusing a single pin or a single signal path for multiple functions and across multiple channels, the functionality of the memory device may be increased without increasing the pin count or making other changes to the device.

Features of the disclosure are initially described in the context of a system, a die, and a structure as described with reference to FIGS. 1-3. Features of the disclosure are described in the context systems and diagrams as described with reference to FIGS. 4-7. These and other features of the disclosure are further illustrated by and described with reference to apparatus diagrams and flowcharts that relate to multi-purpose signaling for a memory system as described with references to FIGS. 8-11.

Figure 1:
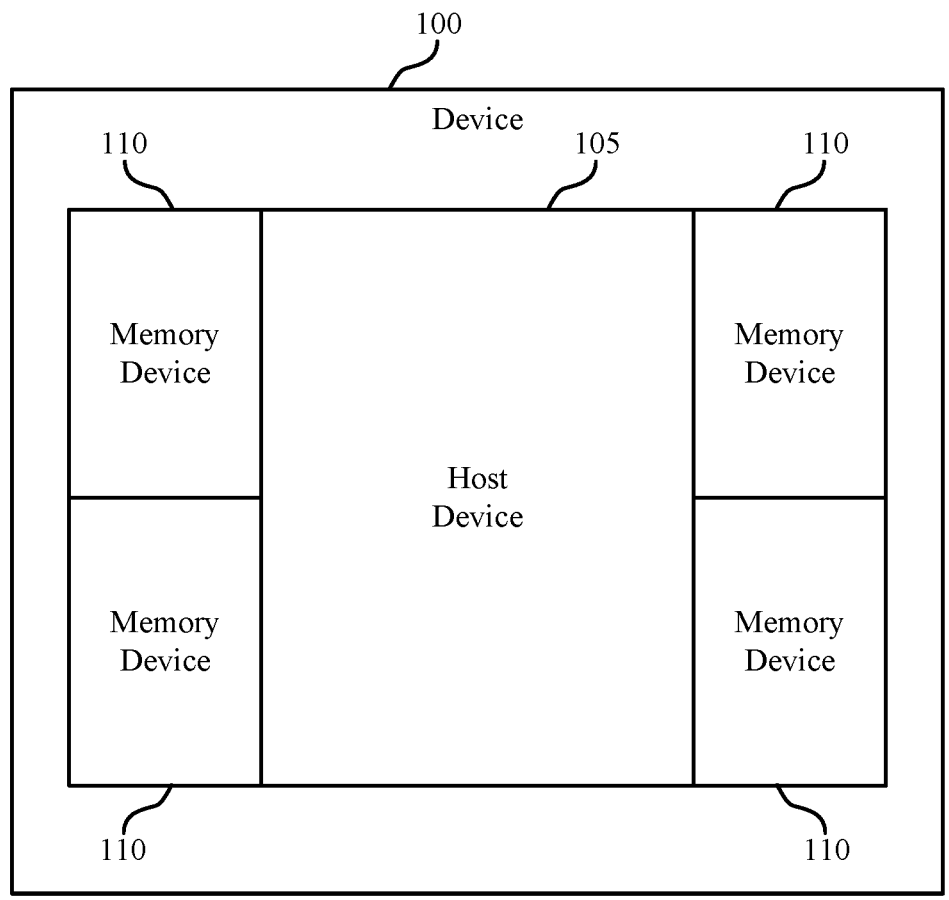
FIG. 1 illustrates an example of a device that supports multi-purpose signaling for a memory system in accordance with examples as disclosed herein.

FIG. 1 illustrates an example of a device 100 that supports multi-purpose signaling for a memory system in accordance with examples as disclosed herein. The device 100 may include a host device 105 and a plurality of memory devices 110. The device 100 may include a host device 105 and a plurality of memory devices 110. The plurality of memory device 110 may be examples a finer grain memory device (e.g., finer grain random-access memory (RAM), finer grain dynamic RAM (DRAM), or finer grain ferroelectric RAM (FeRAM)).

The host device 105 may be an example of a processor (e.g., a central processing unit (CPU), a graphics processing unit (GPU)) or a system on a chip (SoC). In some cases, the host device 105 may be separate component from the memory device such that the host device 105 may be manufactured separately from the memory device. In some cases, the host device 105 may be external to the memory device 110 (e.g., a laptop, server, personal computing device, smartphone, personal computer). In the device 100, the memory devices 110 may be configured to store data for the host device 105. The host device 105 may exchange information with the memory devices 110 using signals communicated over signal paths. In some cases, the signal paths at least partially include an interposer (silicon or organic).

In some situations, the device 100 may perform better using a high-speed connection between the host device 105 and the memory devices 110. As such, some memory devices 110 support applications, processes, host devices, or processors that have multiple TB/s bandwidth needs. Satisfying such a bandwidth constraint within an acceptable energy budget poses challenges.

The memory devices 110 may be configured such that the signal path between the memory cells in the memory devices 110 and the host device 105 are as short as possible. For example, the memory devices 110 may be bufferless memory devices. In another example, the data channels coupling a memory device 110 with the host device 105 may be configured to be shorter than previous designs.

In some cases, an interposer may be used to couple the memory devices 110 with the host device 105. Depending on the constraints of the host device 105 (e.g., bandwidth constraints), various different types of interposers may be used (e.g., silicon interposers or organic interposers). The memory dies of the memory devices 110 may be configured to work with multiple types of interposers. As such, the memory dies of the memory devices 110 may be reconfigurable based on a type of the interposer used to couple the host device 105 with the memory devices 110.

In some cases, the interposer may be a high-density interposer such as a silicon interposer. A high-density interposer may be configured to provide wide communication lanes between connected components (e.g., a memory device 110 and a host device 105). The high-density interposer may include a plurality of high-resistance channels for communicating between devices. The channels may be completely independent of one another in some cases. Some channels may be unidirectional and some channels may be bidirectional.

The high-density interposer may provide wide communication lanes by offering a high quantity of channels to connect components. In some cases, the channels may be thin traces of connecter (e.g., copper), thereby making each individual channel lossy. Because each channel may be highly resistive, as the frequency of data transferred increases, the power needed to transfer the data goes up in a non-linear relationship with the frequency. Such characteristics may impose a practical frequency ceiling that can be used to transmit data given an amount of transmit power over a channel of the high-density interposer. To increase the amount of data transferred in a given amount of time, the high-density interposer may include a very high quantity of channels. As such, a bus of a memory device 110 may be wider than other types of interposer (e.g., organic interposers) used in some DRAM architectures, such as DDR4 (double data rate fourth-generation synchronous dynamic random-access memory) or GDDR5 (double data rate type five synchronous graphics random-access memory). The interposer (whether it is silicon or organic) may be formed of a first material (e.g., silicon or organic) that is different from a second material that forms a substrate of the package.

Other characteristics of the memory devices 110 may also be determined based on the performance constraints and/or the type of the interposer. For example, a channel width of the data channel may be determined. In some memory devices 110, the quantity of data channels may be fixed by legacy technology (e.g., the quantity of data channels between the host device 105 and the memory device 110 may be sixteen data channels). As the channel width goes up, the quantity of pins used to communicate payload data, control data, and/or clock signals may be increased. In other examples, the quantity of banks in a cell region, or said another way, the quantity of banks accessed using a single data channel, may be determined based on the performance constraints and/or the type of the interposer. In other examples, the quantity of clock signals used in the memory devices 110 may be determined based on the performance constraints and/or the type of the interposer. In addition, various characteristics of the clock signals may be determined based on the performance constraints and/or the type of the interposer. For example, the frequency and phase of the clock signals may be determined based on the performance constraints and/or the type of the interposer. In other examples, the use of an error correction code (ECC) pin may be determined based on the performance constraints and/or the type of the interposer. In other examples, pin drivers may be activated or deactivated, as the case may be, based on the performance constraints and/or the type of the interposer. In other examples, whether a memory device 110 includes data channel pairs may be based on the performance constraints and/or the type of the interposer. In other examples, a modulation scheme (e.g., non-return-to-zero (NRZ) or four-symbol phase amplitude modulation (PAM4)) for signals communicated over the pins may be determined based on the performance constraints and/or the type of the interposer.

The memory devices 110 may include one or more vias (e.g., through-silicon vias (TSVs)). In some cases, the one or more vias may be part of internal signal paths that couple controllers with memory cells. The vias may be used to communicate between memory devices 110. In some cases, some vias may be used to facilitate communication between the host device 105 and at least some of the memory devices 110. In some cases, a single via may be coupled with multiple memory devices 110.

One or more signal paths of between a host device 105 and at least some of the memory devices 110 may be configured to support shared pathways between multiple channels and to support multiple functions. For example, a signal path may be configured to communicate a state signal for an initialization sequence of the memory device, an error signal for the memory device to indicate that errors have occurred, or a low-power signal for the host device to request that the memory device enter a low-power mode, or a combination thereof.

Figure 2:
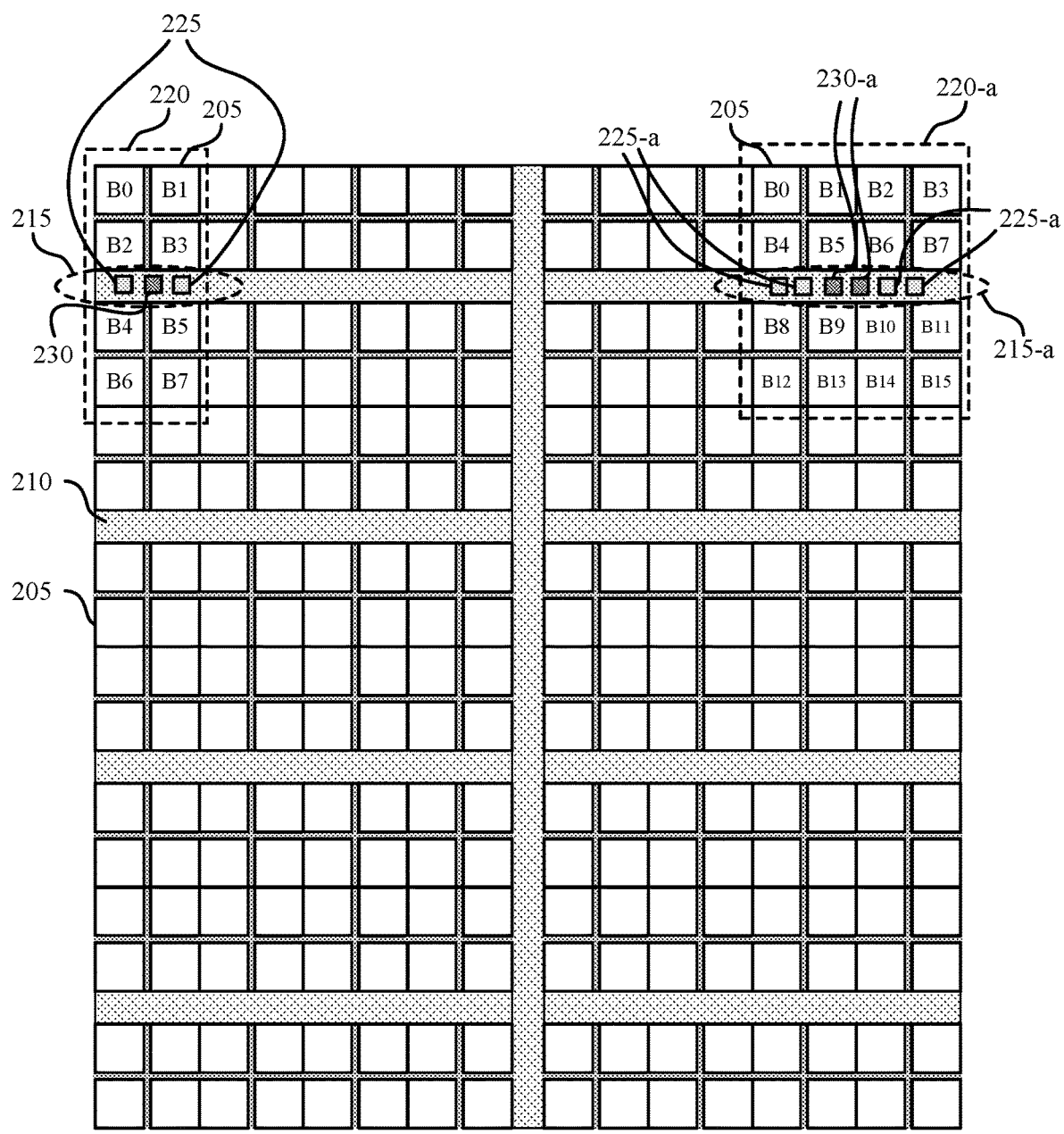
FIG. 2 illustrates an example of a memory die that supports multi-purpose signaling for a memory system in accordance with examples as disclosed herein.

FIG. 2 illustrates an example of a memory die 200 that supports multi-purpose signaling for a memory system in accordance with examples as disclosed herein. In some cases, the memory die 200 may be referred to as a memory array, an array of memory cells, or a deck of memory cells. The various components of the memory die 200 may be configured to facilitate high bandwidth data transfer between the host device and a memory device with which the memory die 200 is associated.

The memory die 200 may include a plurality of banks 205 of memory cells (as represented by the white boxes), a plurality of input/output (I/O) areas 210 (sometimes referred to as I/O regions or I/O stripes) traversing the memory cells of the memory die 200, and a plurality of data channels 215 that couple the memory die 200 with the host device. Each of the banks 205 of memory cells include a plurality of memory cells configured to store data. The memory cells may be DRAM memory cells, FeRAM memory cells, or other types of memory cells described herein. The plurality of I/O areas 210 may include a plurality of power pins and ground pins configured to couple the memory cells of the memory die 200 with power and ground.

The memory die 200 may be divided into cell regions 220 associated with different data channels 215. For example, a single data channel 215 may be configured to couple a single cell region 220 to the host device. The pins of the I/O area may be configured to couple multiple cell regions 220 of the memory die 200 to power, ground, virtual ground, and/or other supporting components.

To provide a high throughput of data (e.g., multiple TB/s) between a host device (not shown) and the memory die 200, a path length between any given memory cell and the host interface may be shortened, as compared to previous solutions. In addition, shortening the data path between any given memory cell and the host device may also reduce the power consumed during an access operation (e.g., read operation or write operation) of that given memory cell. Different architectures and/or strategies may be employed to reduce the size of the data path.

The memory die 200 may be partitioned into a plurality of cell regions 220. Each cell region 220 may be associated with a data channel 215. Two different types of cell region 220 are illustrated, but the entire memory die 200 may be populated with any quantity of cell regions 220 having any shape. A cell region 220 may include a plurality of banks 205 of memory cells. There may be any quantity of banks 205 in a cell region 220. For example, the memory die 200 illustrates a first cell region 220 that includes eight banks 205 and a second cell region 220-*a* that includes sixteen banks 205-*a*. Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 220 may be selected based on the bandwidth constraints of the host device, the power constraints of the host device or the memory device, the size of the data channel, the type of interposer used to couple the memory die 200 with the host device, a data rate associated with the data channel, other considerations, or combinations thereof. In some cases, the memory die 200 may be partitioned such that each cell region 220 is the same size. In other cases, the memory die 200 may be partitioned such that the memory die 200 has cell regions 220 of different sizes.

A data channel 215 (associated with a cell region) may include pins for coupling the memory cells of the cell region 220 with the host device. At least a portion of the data channel 215 may comprise channels of the interposer. The data channel 215 may include a data width specifying how many data pins 225 (sometimes referenced as DQ pins) are in the data channel 215. The quantity of pins in the data channel 215 may be based on the quantity of layers in the memory device because a single data channel 215 may be configured to couple with multiple layers. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 230. Each memory cell in the cell region 220 may be configured to transfer data to and from the host device using the pins 225, 230 associated with the cell region 220. The data channel 215 may also include a clock pin (e.g., CLK) and/or a register clock pin (RCLK). In some cases, the data channel 215 may include an ECC pin (not shown) for facilitating error detection and correction procedures.

In some cases, the I/O area 210 may bisect the banks 205 of memory cells in the cell region 220. In this manner, the data path for any individual memory cell may be shortened. The C/A pin 230 may be configured to communicate command frames between the memory die 200 and the host device.

One or more signal paths of between a host device and the memory die may be configured to support shared pathways between multiple channels and to support multiple functions. For example, a signal path may be configured to communicate a state signal for an initialization sequence of the memory device, an error signal for the memory device to indicate that errors have occurred, or a low-power signal for the host device to request that the memory device enter a low-power mode, or a combination thereof.

Figure 3:
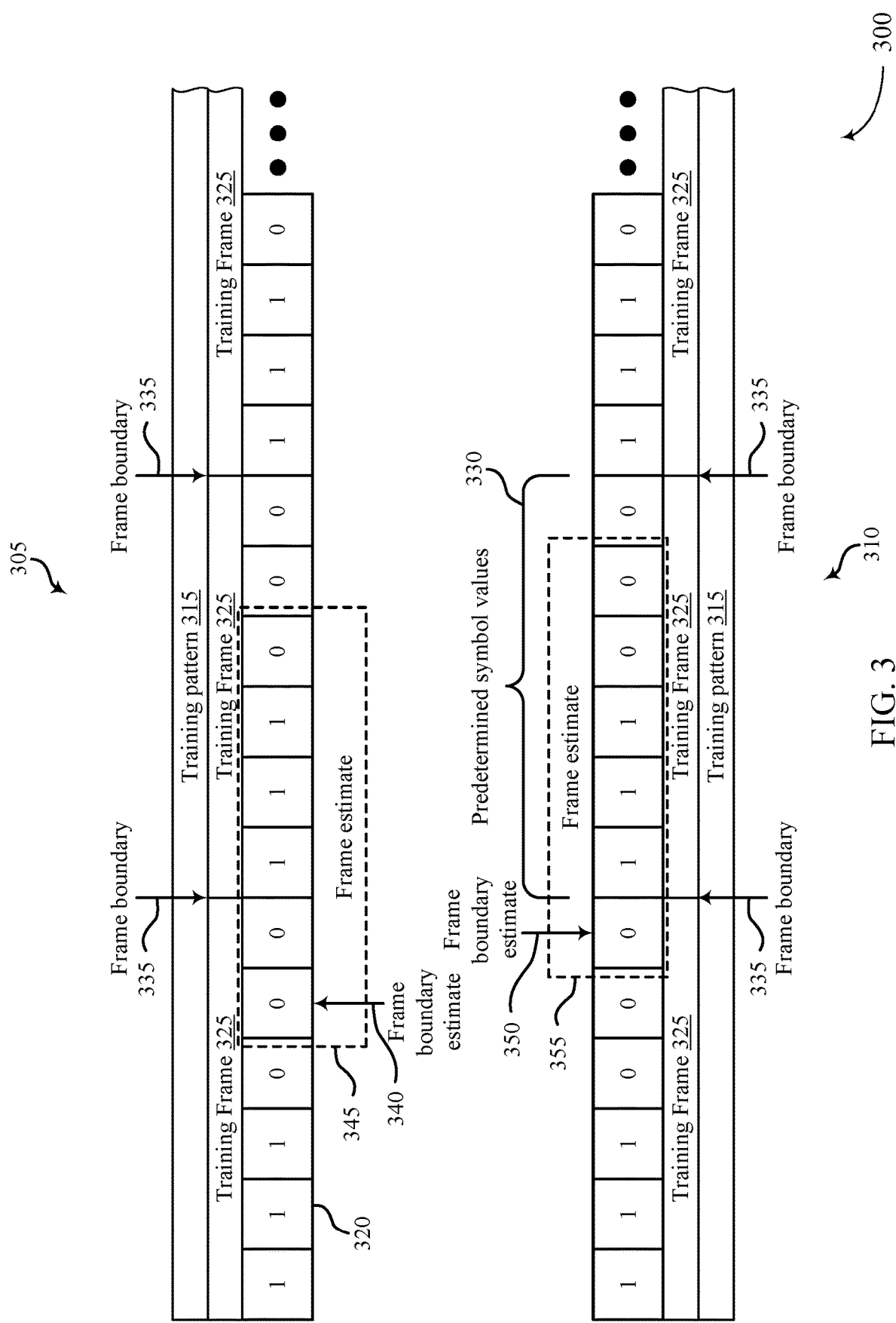
FIG. 3 illustrates an example of a structure that supports multi-purpose signaling for a memory system in accordance with examples as disclosed herein.

FIG. 3 illustrates an example of a structure 300 that supports multi-purpose signaling for a memory system in accordance with examples as disclosed herein. The structure 300 shows two instances (e.g., first instance 305 and second instances 310) of a training pattern 315. Each instance 305, 310 shows a step in the frame training procedure. A frame may refer to a unit of data communicated between a host device and a memory device. The frame may include a quantity of bits communicated after an identified frame boundary. In some cases, a frame may be referred to as a packet.

The frame training procedure is a process by which the memory device identifies a correct frame boundary. With the frame boundary, the memory device may generate a frame clock, which is used to identify frame boundaries (i.e., the start and stop of a frame) during an entire active session. The frame clock may be based on a system clock, a symbol length, and a frame length. In some examples, the system clock may be a write clock (WCK) at a host device. In some cases, the frame clock is a virtual clock that relies on the system clock for its timing. In other cases, the frame clock is a physical clock that is initialized to track the frames.

The training pattern 315 comprises a long train of symbols 320 that are set to predetermined symbol values used to identify a frame boundary. The training pattern 315 may comprise a plurality of training frames 325, each training frame 325 comprising an ordered set of predetermined symbol values 330. An example of the symbol values may be a set of logic '1's followed by a set of logic '0's, or vice versa. The training frame 325 may have a frame length that is equal to a frame length of the frames transmitted by the host device during the active session. Using a plurality of training frames, the memory device may be configured to determine a frame boundary 335 and generate a frame clock that is used to identify the beginning of frames (or the end as the case may be) during the active session.

During the activation time period and as part of a frame training procedure, the host device may transmit the training pattern 315 to the memory device. The memory device may determine when the training pattern is being transmitted so that it may be ready to initialize the frame training procedure.

As shown in the first instance, 305, upon receiving the training pattern 315, the memory device identify a symbol of the training pattern as a first frame boundary estimate 340. Using the first frame boundary estimate and/or a known frame length, the memory device may generate a first frame estimate 345. The first frame estimate 345 include a quantity of symbols of the training pattern 315 equal to the frame length of a training frame 325. The memory device may identify the ordered set of symbols of the first frame estimate 345. The memory device may compare the ordered set of symbols of the first frame estimate 345 to the ordered set of predetermined symbol values 330.

If the ordered set of symbols of the first frame estimate 345 matches the ordered set of predetermined symbol values 330, the memory device may identify the rising edge of the symbol that comprises the first frame boundary estimate 340 as the frame boundary. If the sets do not match, the memory device may a second frame boundary estimate 350 and a second frame estimate 355 as shown in the second instance 310. The memory device may then repeat the same process of comparing the set of symbol values in the second frame estimate 355 to the ordered set of predetermined symbol values 330. This process may continue until a correct frame boundary is found.

In some cases, the difference between the first frame boundary estimate 340 and the second frame boundary estimate 350 may be one symbol. In such cases, the memory device may slip the boundary estimate one symbol upon determining that the frame boundary is not correct. In other cases, the memory device may select the second frame boundary estimate 350 based on a predetermined symbol distance (e.g., one, two, three, four, five, six symbols, etc.). In some cases, the memory device may select the second frame boundary estimate based on the ordered set of symbol values found in the first frame estimate 345. For example, if the memory device knows that the predetermined set of symbol values is 111000 and the set of symbol values of the first frame estimate 345 is 001110, the memory device may identify the third symbol of the first frame estimate 345 as the second frame boundary estimate 350.

Once the memory device identifies the correct frame boundary, the memory device may generate a frame clock based on the frame synchronization process. The frame clock may indicate the beginning of a new frame through the active session. Using the frame clock, the memory device and the host device may not need to use headers to indicate the location of frames, thereby freeing up more symbols for substantive data. In some cases, the frame boundary may be aligned with a rising edge of a first symbol (or a first symbol period) in the frame. As such, the frame clock may also be aligned with a rising edge of the symbol period of the frame.

One or more signal paths of between a host device and at least some of the memory devices may be configured to support shared pathways between multiple channels and to support multiple functions. For example, a signal path may be configured to communicate a state signal for an initialization sequence of the memory device, an error signal for the memory device to indicate that errors have occurred, or a low-power signal for the host device to request that the memory device enter a low-power mode, or a combination thereof.

Figure 4:
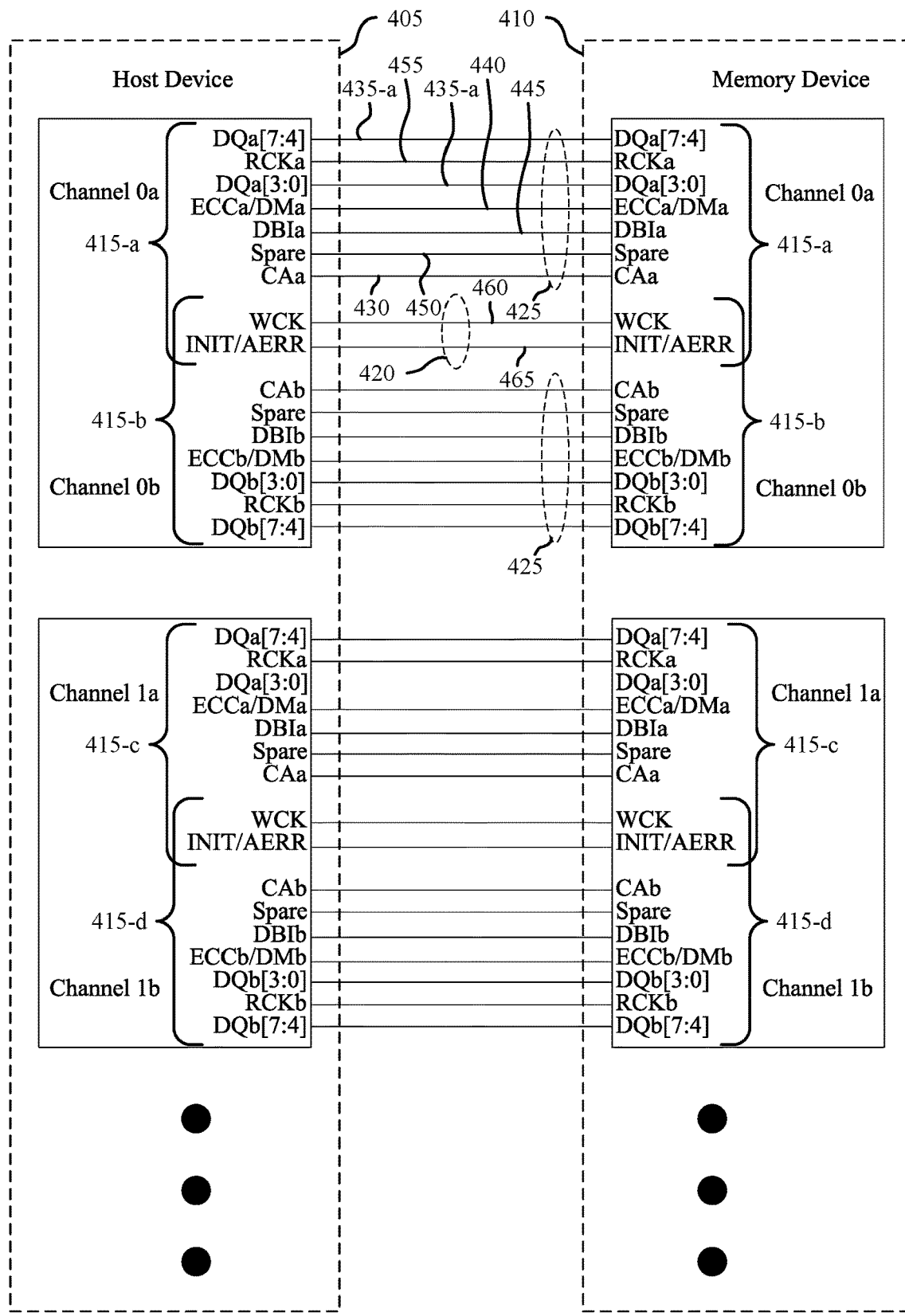
FIG. 4 illustrates an example of a system that supports multi-purpose signaling for a memory system in accordance with examples as disclosed herein.

FIG. 4 illustrates an example of a system 400 that supports multi-purpose signaling for a memory system in accordance with examples as disclosed herein. The system 400 may include a host device 405, a memory device 410, and a plurality of channels 415 coupling the host device 405 with the memory device 410. The system 400 may include one or more memory devices but aspects of the one or more memory device 410 may be described in the context of a single memory device (e.g., memory device 410). The memory devices 410 may be examples of magnetic hard disks, random access memory (RAM), read-only memory (ROM), DRAM, synchronous dynamic RAM (SDRAM), FeRAM, magnetic RAM (MRAM), resistive RAM (RRAM), flash memory, phase change memory (PCM), self-selecting memory, chalcogenide memory technologies, others, or combinations thereof.

The system 400 may include portions of an electronic device, such as a computing device, a mobile computing device, a wireless device, a graphics processing device, a vehicle, or other systems. For example, the system 400 may illustrate aspects of a computer, a laptop computer, a tablet computer, a smartphone, a cellular phone, a wearable device, an internet-connected device, a vehicle controller, or the like. The memory device 410 may be a component of the system operable to store data for one or more other components of the system 400.

The memory device 410 may be an independent device or a component that is operable to provide physical memory addresses/space that may be used or referenced by the system 400. In some examples, the memory device 410 may be configurable to work with one or more different types of host devices 405. Signaling between the host device 405 and the memory device 410 may be operable to support one or more of: modulation schemes to modulate the signals, various pin configurations for communicating the signals, various form factors for physical packaging of the host device 405 and the memory device 410, clock signaling and synchronization between the host device 405 and the memory device 410, timing conventions, or other factors.

The memory device 410 may be operable to store data for the components of the host device 405. In some examples, the memory device 410 may act as a slave-type device to the host device 405 (e.g., responding to and executing commands provided by the host device 405). Such commands may include one or more of a write command for a write operation, a read command for a read operation, a refresh command for a refresh operation, or other commands.

In some examples, the host device 405 may refer to the hardware, firmware, software, or a combination thereof that implements the functions of an external memory controller. The host device 405 may include an external memory controller or other components such as one or more peripheral components or one or more input/output controllers. In some examples, the host device 405, or its functions described herein, may be implemented a processor. In some cases, the host device 405 may be referred to as a controller or an external memory controller.

The components of the host device 405 may exchange information with the memory device 410 using one or more channels 415. The channels 415 may be operable to support communications between the host device 405 and the memory device 410. Each channel 415 may be examples of transmission mediums that carry information between the host device 405 and the memory device. Each channel 415 may include one or more signal paths or transmission mediums (e.g., conductors) between terminals associated with the components of system 400. A signal path may be an example of a conductive path operable to carry a signal. For example, a channel 415 may include a first terminal including one or more pins or pads at the host device 405 and one or more pins or pads at the memory device 410. A pin may be an example of a conductive input or output point of a device of the system 400, and a pin may be operable to act as part of a channel.

A channel 415 may be dedicated to communicating one or more types of information with a portion of memory cells of the memory device 410. A channel may refer to one or more combinations of all command and data lanes associated with a portion of memory cells. The channel 415 may include a first set of signal paths 420 that are dedicated to the portion of the memory cells and a second set of signal paths 425 that are shared between two or more channels. The first and second sets of signal paths may span between the host device 405 and the memory device 410. The first set of signal paths 420 of the channel 415 may include one or more command/address (CA) signal paths, spare signal paths, data bus inversion (DBI) signal paths, error-correcting code (ECC) or data mask (DM) signal paths, data (DQ) signal paths, and return clock (RCK) signal paths. The second set of signal paths 425 of the channel 415 may include one or more WCK signal paths and one or more INIT/AERR signal paths. In some examples, information may be communicated over the channels 415 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Any numerical quantity of channels may extend between the host device 405 and the memory device 410. Four channels are shown in FIG. 4 including a first channel 415-*a*, a second channel 415-*b*, a third channel 415-*c*, and a fourth channel 415-*d*. The first channel 415-*a* and the second channel 415-*b* form a channel pair that share at least some signal paths (e.g., second set of signal paths 425) and the third channel 415-*c* and the second channel 415-*d* form a channel pair that share at least some signal paths (e.g., second set of signal paths 425). For illustrative purposes, the signal paths of the first channel 415-*a* are described and those descriptions apply to the other channels.

The first channel 415-*a* may include one or more CA signal paths 430. The CA signal paths 430 may be operable to communicate commands between the host device 405 and the memory device 410 including control information associated with the commands (e.g., address information). For example, the CA signal paths 430 may include a read command with an address of the desired data. In some examples, a CA signal path 430 may include any number of signal paths to decode one or more of address or command data (e.g., eight or nine signal paths).

The first channel 415-*a* may include one or more DQ signal paths 435 that may be configured to communicate data and/or control information between the host device 405 and the memory device 410. For example, the data signal paths 435 may communicate information (e.g., bi-directional) to be written to the memory device 410 or information read from the memory device 410. The data signal paths 430 may communicate signals that may be modulated using a variety of different modulation schemes (e.g., non-return-to-zero (NRZ), four-level pulse amplitude modulation (PAM4)). In some cases, the DQ signal paths 435 may include a first set of DQ signal paths 435-*a* (e.g., DQ[3:0]) and a second set of DQ signal paths 435-*b* (e.g., DQ[7:4]) in a given channel 415.

The first channel 415-*a* may include one or more ECC signal paths 440 that may be configured to use ECC codewords to detect and/or correct errors found in the information communicated over the one or more channels. The ECC codewords may be generated and transmitted by the host device 405 or the memory device 410. In some cases, the one or more ECC signal paths 440 may be examples of one or more DM signal paths configured to communicate a mask control signal. The mask control signal may be used to block a portion of information in the signal path from reaching one or more memory cells.

The first channel 415-*a* may include one or more DBI signal paths 445 that may enhance signal integrity and decrease power consumption. The DBI signal paths 445 may allow one or more data signals to be transmitted from one device to another. The DBI signal path 445 may be configured to invert some or all of the data bits prior to transmission The first channel 415-*a* may include one or more spare signal paths 450. The spare signal paths 450 may be operable to reroute signals between the host device 405 and the memory device 410 when a failed or defective signal path is identified.

The first channel 415-*a* may include one or more return clock signal (RCK) signal paths 455. The RCK signal path 455 may communicate a signal that provides a timing reference for signals communicated from the memory device 410 to the host device 405.

The first set of signal paths 425 that are dedicated to a single channel (e.g., the first channel 415-*a*) may include the signal paths 430, 435, 440, 445, 450, and 455. As such, the data for each of these signal paths may be dedicated to that signal channel.

The first channel 415-*a* may include one or more write clock signal (WCK) signal paths 460. The WCK signal path 460 may communicate a signal that provides a timing reference for signals communicated from the host device 405 to the memory device 410. The WCK signal path 460 may be shared between two or more channels (e.g., the first channel 415-*a* and the second channel 415-*b*). As such, the WCK signal path 460 may be part of the second set of signal paths 425 shared between two or more channels.

The clock signal communicated over the WCK signal path 460 may be configured to coordinate an access operation (e.g., a write operation or read operation) of the host device 405 with the memory device 410. In some cases, the clock signal may be a differential output (e.g., a WCK_t signal and a WCK_c signal) and the signal paths of the WCK signal paths 460 may be configured accordingly. A WCK signal paths may include any quantity of signal paths. The data clock signal WCK may be generated by a data clock, which may include one or more hardware components (e.g., oscillators, crystals, logic gates, transistors, or the like).

The clock signal paths (e.g., WCK signal path 460 and RCK signal path 455) may be operable to communicate one or more clock signals between the host device 405 and the memory device 410. Each clock signal may be operable to oscillate between a high state and a low state, and may support coordination (e.g., in time) between actions of the host device 405 and the memory device 410. In some examples, the clock signal may provide a timing reference for command and addressing operations for the memory device 410, or other system-wide operations for the memory device 410. A clock signal therefore may be referred to as a control clock signal, a command clock signal, or a system clock signal.

In some examples, the first channel 415-*a* may include one or more initialization and address error (INIT/AERR) signal paths 465. The INIT/AERR signal path 465 may be shared between independent channels (e.g., first channel 415-*a* and second channel 415-*b*). The INIT/AERR signal path 465 are operable to communicate one or more of data or control information between the host device 405 and the memory device 410. The INIT/AERR signal paths 465 may communicate information (e.g., bi-directional) to be written to the memory device 410 or information read from the memory device 410.

The INIT/AERR signal path 465 may have more than one functions, based on the mode of operation of the memory device 410. In some cases, the INIT/AERR signal path 465 may function as a clock. For example, in the event a power-on or hard reset of the system occurs, the INIT/AERR signal path 465 may communicate signal that acts as a clock for an initialization operation of the memory device 410 Additionally or alternatively, the clock function of the INIT/AERR signal path 465 may advance the state transition of a finite state machine in the memory device 410 used for the initialization operation.

The INIT/AERR signal path 465 may communicate an error signal when the memory device 410 is operating in a normal mode. The error signal may represent the transmission of one or more error signals between the memory device 410 and the host device 405. A memory device may be configured to perform a parity check or some other type of error detection procedure and transmit an error indication after determining that training command and/or a corrupted command has been received. By transmitting an error indication, the memory device 410 may report to a host device 405 that a command was incorrectly received at the memory device 410 (e.g., due to transmission errors, reception errors, and/or decoding errors) over the INIT/AERR signal path 465. When a host device 405 receives error indication after transmitting training command, the host device 405 may determine reporting interval as the time between transmitting training command and receiving error indication.

The INIT/AERR signal path 465 may communicate a signal for the memory device 410 to enter a low-power mode when operating in a normal mode. The memory device 410 may be deactivated or partially deactivated as part of the low-power mode). The power down mode may be a low-power mode with a relatively shorter latency. The memory device may power down after performing a refresh operation with modified parameters.

Figure 5:
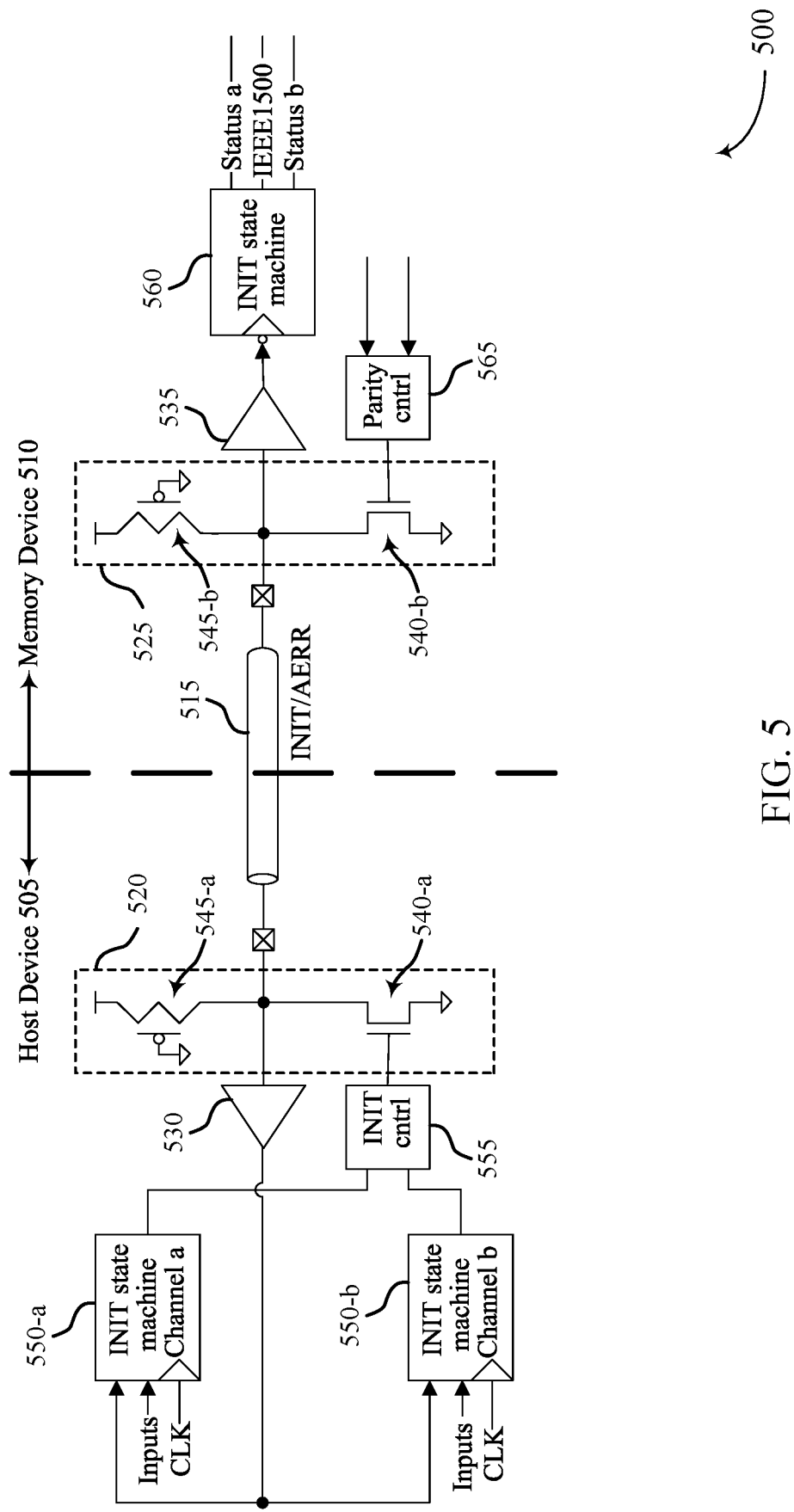
FIG. 5 illustrates an example of a system that supports multi-purpose signaling for a memory system in accordance with examples as disclosed herein.

FIG. 5 illustrates an example of a system 500 that supports multi-purpose signaling for a memory system in accordance with examples as disclosed herein. System 500 may be an example of portions of a portion of the system described with reference to FIG. 4. The system 500 may include a host device 505 and a memory device 510.

The system 500 may include an open-drain signaling protocol. For example, an INIT/AERR signal path 515 may be coupled with one or more sources. For example, the INIT/AERR signal path 515 may be coupled with a first driver 520, a second driver 525, a first receiver 530, and a second receiver 535. The drivers 520 and 525 may be configured to drive signals across the INIT/AERR signal path 515. The receivers 530 and 535 may be configured receive signals across the INIT/AERR signal path 515. The drivers 520 and 525 may include a pull-down transistor 540 (e.g., transistor 540-*a* and transistor 540-*b*) and a high-impedance pull-up circuit 545 (e.g., circuit 545-*a* and circuit 545-*b*). The pull-down transistor 540 may be used to transition the default state of the digital pin to a low signal (e.g., logic 0), to counter the high-impedance pull-up circuit that may be associated with a high signal (e.g., logic 1). The impedance of the pull-up circuits 545 may be adjusted through fuse settings or control register signals to adjust one or more pull-up slew rates and/or termination loads depending on configuration. The INIT/AERR signal path 515 may be an example of an INIT/AERR signal path 465 described with reference to FIG. 4. The drivers 520 and 525 and the receivers 530 and 535 may be configured to communicate a signal modulated using a first modulation scheme comprising two states (e.g., a non-return to zero (NRZ) modulation scheme or a pulse amplitude modulation (PAM) scheme that includes two levels) or a second modulation scheme comprising three or more states (e.g., PAM3, PAM4, PAM5, PAM6, etc.).

In FIG. 5, there is one memory device load on the signal causing a pull-up impedance looking into the memory device 510 to be a single load. In this configuration, it may be useful to adjust the pull-up impedance of the driver 525 or 520 so that the pull-down impedance can transition the signal to logic "low" and still provide adequate pull-up slew rate at each signal detector when the signal is undriven. This signal topology is not directly synchronous to a receiving clock and may be considered asynchronous. The receivers 530 and 535 may be designed to have a trip point in the signal transition range and possibly hysteresis around the trip point, similar to a Schmidt trigger design, to provide reliable operation.

In some examples, the system 500 includes an interface with one or more shared pins (e.g., the INIT/AERR signal path 515). A shared pin of the one or more shared pins may be connected to a signal path (e.g., the INIT/AERR signal path 515) between a first channel and a second channel. In some cases, the shared pin may communicate an initialization signal. The initialization signal may indicate a state transition (e.g., a transition from a first state to a second state). Additionally or alternatively, the shared pin may include a signal associated with storing or receiving data. In some examples, during an operating mode, the shared pin may indicate an error occurred. The error signal may be communicated over the first channel of the second channel. In some cases, a control component may be operable to detect the error.

The host device 505 and the memory device 510 may include one or more control components to drive signals across the INIT/AERR signal path 515 based on the function being performed. Examples of the functions that can be performed using the INIT/AERR signal path 515 include an initialization sequence (e.g., communicates a clock for the initialization sequence), parity checking (e.g., communicates an error signal), entering low-power mode (e.g., communicates a power down signal), or a combination thereof.

There are a variety of reasons for using a single signal path for multiple functions. First, a single signal path will reduce power and circuit overhead of an additional I/O signal to drive off-chip versus adding dedicated signal paths. Second, a single signal path saves area and integrated circuit package complexity by reducing pin count. Each of the logical functions of the signal must be compatible with the signaling protocol used; in this case, open-drain. It is possible more than one multifunction pin could be shared between independent channels with each signal using different signaling technologies. This would allow each signal to support different subsets of functions based on signaling protocol compatibility. In this embodiment, the open drain signaling protocol may support each function assigned to the INIT/AERR signal path 515.

The host device 505 may include one or more control components 550 (e.g., control component 550-*a* and control component 550-*b*) configured to control the functions associated with the INIT/AERR signal path 515. The one or more control components 550 may include one or more inputs, including a clock input, an input from the host device 505 and an input from the receiver 530 of the host device 505. The host device 505 may include a control component 555 coupled with a gate of the pull-down transistor 540-*a* of the driver 520. The control component 555 may be configured to drive a signal across the INIT/AERR signal path 515 by applying a voltage to the gate of the pull-down transistor 540-*a*. The control component 555 may apply the voltage based on receiving a command from the one or more control components 550.

The memory device 510 may include one or more control components 560 configured to control the functions associated with the INIT/AERR signal path 515. The one or more control components 560 may include one or more inputs, including an input from the receiver 535 of the memory device 510, a side channel input (labeled IEEE1500) that is configured to provide side-channel for controlling the control component during testing, trouble-shooting, or overriding of the control component. The memory device 510 may include a control component 565 coupled with a gate of the pull-down transistor 540-*b* of the driver 525. The control component 565 may be configured to drive a signal across the INIT/AERR signal path 515 by applying a voltage to the gate of the pull-down transistor 540-*b*. The control component 565 may apply the voltage based on receiving a command from the one or more control components 560.

In some examples of an initialization sequence, the one or more control components 550 of the host device 505 may be configured to implement an initialization sequence. The control component 555 of the host device 505 may cause a signal to be driven over the INIT/AERR signal path 515 to advance the finite state machine of the initialization sequence to another state. The memory device 510 may receive the signal driven over the INIT/AERR signal path 515 and may send that signal to the control component 560. The control component 560 may be configured to implement an initialization sequence. The one or more control components 550 and the control component 560 may implement the finite state machine described with reference to FIG. 6 as part of the initialization sequence.

In some examples of a parity check, the control component 560 (or some other controller of the memory device 510) may perform an error check on a signal received over one or more other signal paths (e.g., data signal paths 435 described with reference to FIG. 4). If an error in the signal is detected, the control component 565 may receive a signal to cause a signal to be driven across the INIT/AERR signal path 515. The one or more control components 550 may be configured to receive the signal driven over the INIT/AERR signal path 515 and may be configured to cause the host device 505 to retransmit the signal with the detected error.

In some examples of a low-power mode, the one or more control components 550 of the host device 505 may be configured to determine whether the memory device 510 is to enter a low-power mode. The control component 555 of the host device 505 may cause a signal to be driven over the INIT/AERR signal path 515 to cause the memory device 510 to enter a low power mode. The memory device 510 may receive the signal driven over the INIT/AERR signal path 515 and may send that signal to the control component 560. The control component 560 may be configured to cause the memory device 510 to enter the low-power mode.

Figure 6:
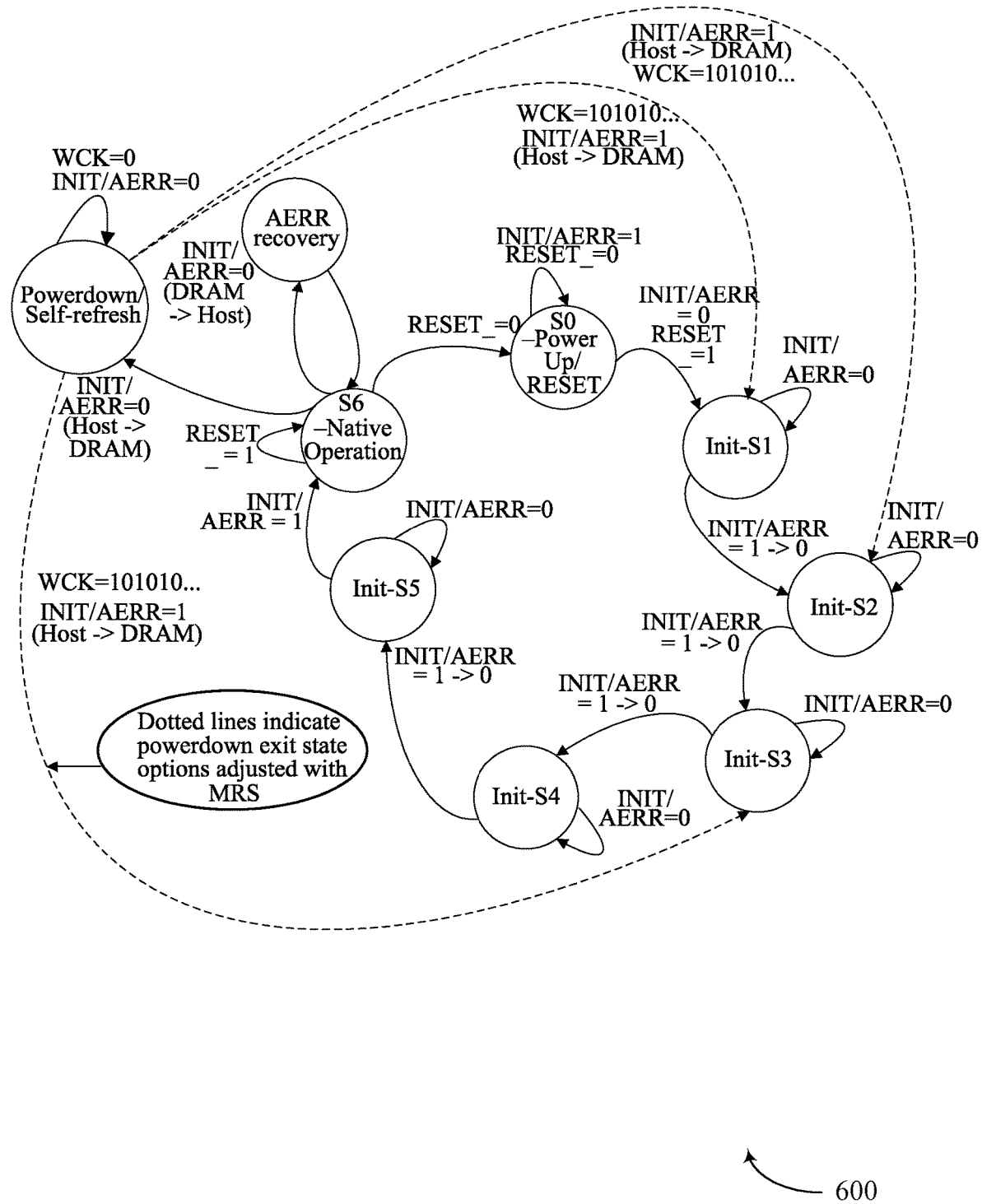
FIG. 6 illustrates an example of a state diagram that supports multi-purpose signaling for a memory system in accordance with examples as disclosed herein.

FIG. 6 illustrates an example of a state diagram 600 that supports multi-purpose signaling for a memory system in accordance with examples as disclosed herein. State diagram 600 may indicate examples of how a shared INIT/AERR signal path may function functions as a clock for the finite state machine (FSM) associated with an initialization sequence of a memory device. In such cases, the time between each INIT/AERR transition may be determined by the length of time required to complete each step of the initialization sequence.

In some examples, when the INIT/AERR signal path is driven to '0' by the host device (e.g., the controller), the FSM may transition to the next state (an exception is made for the S0 to S1 transition and S6). Following an INIT/AERR transition to '0', if the INIT/AERR signal remains '0', the FSM maintains its current state. When INIT/AERR is released by the host device pull-down and allowed to transition to '1', the FSM of the memory device also remains in the current state until a transition to '0' where the FSM transitions to the next state and remains in that state until the host device completes the next '0'→'1'→'0' transition on the INIT/AERR signal path. In this fashion, the host device may control the progression through the initialization sequence using the INIT/AERR signal as a clock to the memory device. Each of the FSM states determine the specified behavior of the host device and memory device at each step of the initialization sequence or communications channel training.

In some examples, the multi-function signal communicated over the INIT/AERR signal path is a 2-state signal so that any transition on the signal path may be interpreted by logic on the sender or receiver based on temporal context or based on deducing which device is driving the signal. Other signaling technologies, such as PAM4, may be used to indicate multiple functions based on 4 possible states of the signal thereby eliminating the requirement for finite state machines to track the function of the signal although possibly adding a required clock signal to validate the discrete state of the PAM4 signal or more complex circuitry to the drivers and/or receivers associated with the INIT/AERR signal path. Moving through the state transitions shown in FIG. 6, we can see how the function of the signal changes depending on the current state of the finite state machines at the host device and the memory device. For example, the host device drives the INIT/AERR signal as a clock starting with the '0' transition at S0 and proceeding through each state until state, "Init-S5." Following completion of S5, the host device may release control of the INIT/AERR signal allowing the pull-up devices to transition the INIT/AERR to '1' forcing the memory device FSM to transition to state, "S6-Native Operation." In S6, the memory device may maintain operation until interrupted by a transition on the RESET signal or a transition on INIT/AERR. If there is a '0' transition on INIT/AERR while in state S6, the memory device and the host device can deduce the source of the transition through internal driving signal states and interpret the '0' on INIT/AERR in two different ways. If the memory device is driving the '0' on INIT/AERR while in S6, the INIT/AERR is functioning as a communications channel error signal (AERR) and the system may recover from this condition in a pre-defined manner. Otherwise, if the host device drives INIT/AERR to '0' while in S6, the host device and the memory device may interpret the transition as forcing the memory device into a low-power mode in which case the INIT/AERR is acting as a power mode indicator. In some cases, the error signal may be referred to as a parity signal.

A possible check on the state transitions in the memory device is to transmit a static pattern on the DQx[7:0] bus to indicate the current state of the memory device FSM.

Making the state of the FSM observable to the host device may allow an additional check on the communication between the host device and the memory device during the initialization phase of the system initialization. Once the FSM is in S6, the memory device may enter native operation and may cease driving the current state on the DQx[7:0] signals. Also, a side-channel protocol, such as IEEE 1500 may be used to force the memory device FSM into any valid state.

Another example of the FSM is illustrated by the dotted lines in FIG. 6, which indicate three possible exit states for the FSM coming out of a power down mode. Such behavior can be programmed into a mode register on the memory device. Another power down exit strategy may include the host device to drive a static value on the DQx[7:0] bus to indicate an exit state to the memory device FSM. The memory device may then latch the indicated state with the transition of the INIT/AERR signal.

Functions of the memory device may be made available through a single pin shared between more than one independent channel based upon temporal and logical conditions between the memory device and the host device. Using a single pin may result in a reduction of power and area as compared to examples that include dedicated pins for each function.

Figure 7:
FIG. 7 illustrates an example of a diagram that supports multi-purpose signaling for a memory system in accordance with examples as disclosed herein.

FIG. 7 illustrates an example of a diagram 700 that supports multi-purpose signaling for a memory system in accordance with examples as disclosed herein. The diagram 700 illustrates the functions performed by an INIT/AERR signal path relative to different modes of operation of a memory device. The memory device described in diagram 700 may be an example of memory devices described with reference to FIGS. 1-6. The INIT/AERR signal path described in diagram 700 may be an example of the INIT/AERR signal paths described with reference to FIGS. 4-6.

The memory device may be configured to operate in two or more modes of operation. A first mode of operation may be an example of a training mode or an initialization mode. The first mode may occur after a start-up event associated with the memory device. During the first mode of operation, the memory device may initialize one or more aspects of the memory device to support normal operations with a host device. During a first mode of operation, the INIT/AERR signal path may be configured to communicate a clock signal for an initialization sequence. Such a clock signal may be transmitted by the host device to the memory device. The clock signal may indicate when the memory device is to transition to a next state of a finite state machine associated with the initialization sequence.

A second mode of operation may be an example of a normal mode of operation. The second mode may occur after the first mode, in some examples. In some cases, after the initialization sequence is complete, the memory device may enter the second mode. In some examples, the second mode may be an example of the state "S6-Native Operation" described with reference to FIG. 6.

During the second mode of operation, the memory device may be configured to store data for the host device and/or respond to commands from the host device. During a second mode of operation, the INIT/AERR signal path may be configured to perform one of two functions. For a first function, the INIT/AERR signal path may be configured to communicate an error signal from the memory device to the host device. The memory device may perform one or more error checks on information received from the host device. If the memory device detects one or more errors in such information, the memory device may transmit a signal over the INIT/AERR signal path to indicate the error to the host device. The host device may implement one or more operations in response to receiving the error signal. For a second function, the INIT/AERR signal path may be configured to communicate a low-power signal from the host device to the memory device. If the host device determines that the memory device is to enter a low-power mode, the host may transmit a signal over the INIT/AERR signal path to indicate as such to the memory device. The memory device may enter the low-power mode based on receiving the low-power mode signal.

In the second mode of operation there is a possibility of a collision of signal on the INIT/AERR signal path. For example, the memory device may attempt to transmit an error signal to the host device at the same time that the host device may attempt to transmit a lower-power signal to the memory device over the INIT/AERR signal path. In such examples, one of the signals may take priority over the other signal. For example, the error signal may take priority over the low-power signal. In some cases, the host device or the memory device may determine whether the signal on the INIT/AERR signal path is the error signal or the low-power signal based on identifying whether it is the host device or the memory device driving the signal. For example, the memory device may receive a signal over the INIT/AERR signal path and may determine that the signal is not being driver by the driver of the memory device. In such examples, the memory device may determine that the signal received over the INIT/AERR signal path is a low-power signal from the host device.

Figure 8:
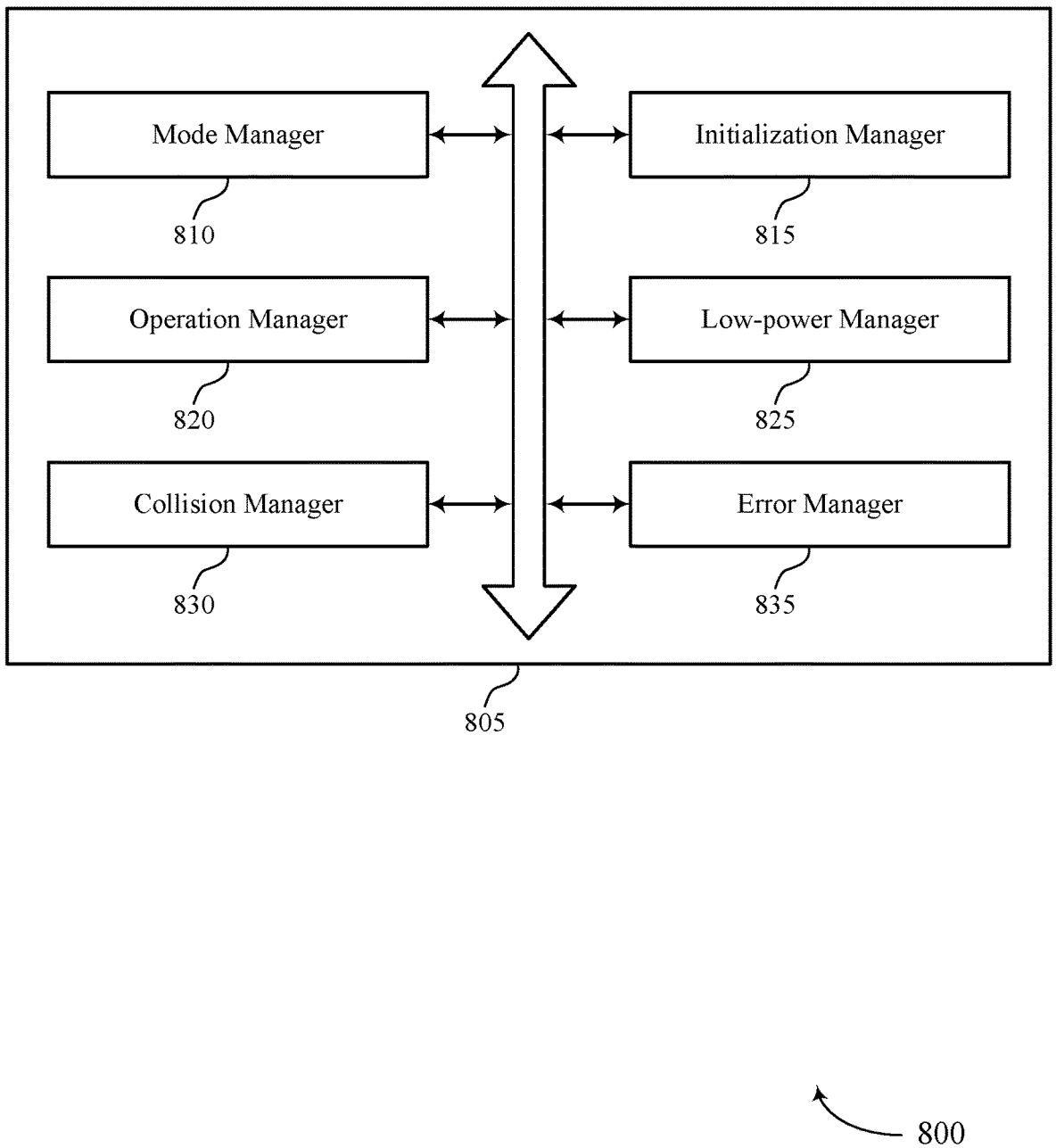
FIG. 8 shows a block diagram of a memory device that supports multi-purpose signaling for a memory system in accordance with examples as disclosed herein.

FIG. 8 shows a block diagram 800 of a memory device 805 that supports multi-purpose signaling for a memory system in accordance with examples as disclosed herein. The memory device 805 may be an example of aspects of a memory device as described with reference to FIGS. 1-7. The memory device 805 may include a mode manager 810, an initialization manager 815, an operation manager 820, a low-power manager 825, a collision manager 830, and an error manager 835. Each of these modules may communicate, directly or indirectly, with one another (e.g., via one or more buses).

The mode manager 810 may enter, by the memory device, a second mode associated with storing data for a host device based on receiving the first signal. In some examples, the mode manager 810 may enter, by the memory device, the third mode that is the low-power mode based on receiving the third signal while operating in the second mode.

In some examples, transition from the first state of the initialization sequence to the second state of the initialization sequence based on receiving the first signal, where entering the second mode is based on transitioning from the first state to the second state, where the first state includes a final state of the initialization sequence.

The initialization manager 815 may receive, by a memory device operating in a first mode associated with an initialization sequence and over a signal path shared between channels of the memory device, a first signal for indicating that the memory device transition from a first state of the initialization sequence to a second state of the initialization sequence. In some examples, the initialization manager 815 may identify that the initialization sequence associated with the first mode is complete, where entering the second mode is based on identifying that the initialization sequence associated with the first mode is complete. In some cases, the first signal includes a clock signal for progressing the memory device through states of the initialization sequence.

In some cases, the first state and the second state include a portion of a finite state machine associated with the initialization sequence.

The operation manager 820 may detect, by the memory device in the second mode, an error associated with one or more signals communicated over at least one of the channels. In some examples, the operation manager 820 may transmit, by the memory device in the second mode and over the signal path shared between the channels of the memory device, a second signal based on detecting the error, the second signal for indicating that the error occurred.

In some examples, the operation manager 820 may activate a pull-down transistor to transition a voltage of the signal path from a first voltage level to a second voltage level, where transmitting the second signal is based on activating the pull-down transistor. In some cases, the signal path is a high-terminated signal path. In some cases, the second voltage level is less than the first voltage level. In some cases, the first signal or the second signal are modulated using a modulation scheme that includes three or more symbols. In some cases, the signal path is shared between a first channel of the memory device and a second channel of the memory device. In some cases, the signal path is operable to communicate two or more types of signals for either the first channel or the second channel.

The low-power manager 825 may receive, by the memory device operating in the second mode, a third signal over the signal path shared between the channels of the memory device, the third signal for indicating to the memory device to enter a third mode that is a low-power mode.

The collision manager 830 may prioritize, by the memory device operating in the second mode, one or more operations associated with the third signal based on a collision between the second signal and the third signal occurring on the signal path. In some examples, the collision manager 830 may identify whether the memory device is driving a signal over the signal path, where receiving the third signal is based on whether the memory device is driving the signal over the signal path.

The error manager 835 may detect the error associated with a signal communicated over a first channel of the channels or detecting the error associated with a signal communicated over a second channel of the channels, where transmitting the second signal is based on detecting the error for the first channel or detecting the error for the second channel. In some cases, the second signal includes a parity signal.

Figure 9:
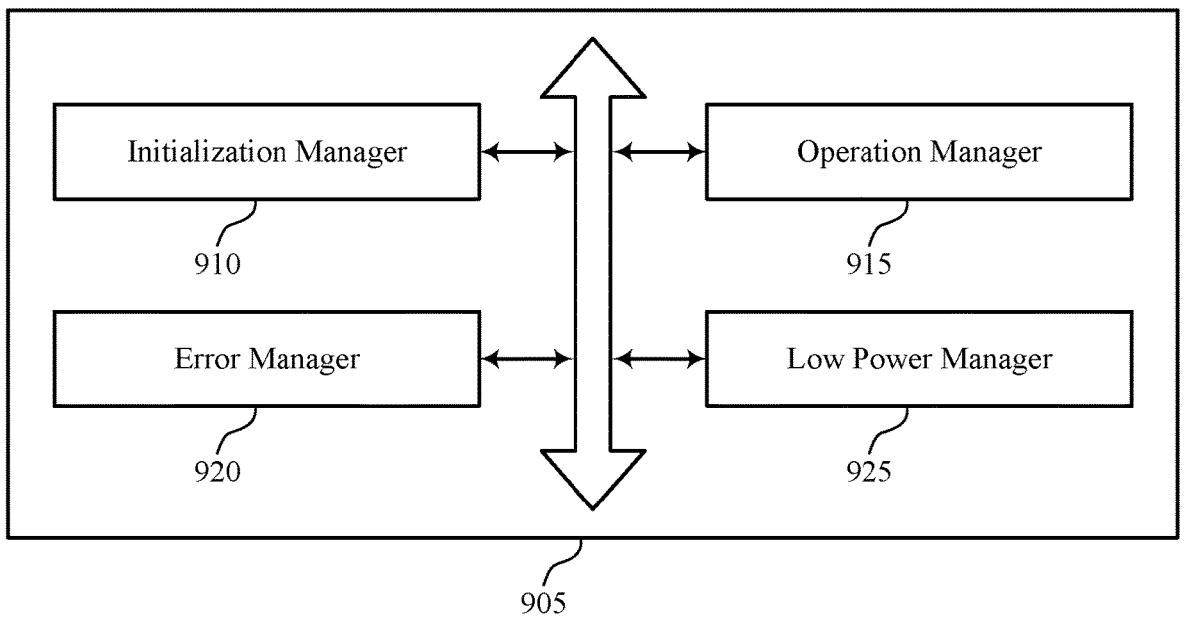
FIG. 9 shows a block diagram of a host device that supports multi-purpose signaling for a memory system in accordance with examples as disclosed herein.

FIG. 9 shows a block diagram 900 of a host device 905 that supports multi-purpose signaling for a memory system in accordance with examples as disclosed herein. The host device 905 may be an example of aspects of a host device as described with reference to FIGS. 1-7. The host device 905 may include an initialization manager 910, an operation manager 915, an error manager 920, and a low power manager 925. Each of these modules may communicate, directly or indirectly, with one another (e.g., via one or more buses).

The initialization manager 910 may transmit, by a host device as part of an initialization sequence and over a signal path shared between channels of a memory device, a first signal for indicating to the memory device to transition from a first state of the initialization sequence to a second state of the initialization sequence. In some examples, the initialization manager 910 may identify, by the host device, that the initialization sequence for the memory device is complete based on transmitting the first signal. In some examples, the initialization manager 910 may identify that the memory device is to transition states in the initialization sequence, where transmitting the first signal is based on identifying that the memory device is to transition the states in the initialization sequence. In some cases, the first signal includes a clock signal for progressing the memory device through states of the initialization sequence.

The operation manager 915 may receive, by the host device and over the signal path shared between the channels of the memory device, a second signal based on the initialization sequence being complete, the second signal for indicating that an error occurred for one or more signals communicated over at least one of the channels.

The error manager 920 may transmit, by the host device, a third signal over the signal path shared between the channels of the memory device, the third signal for indicating to the memory device to enter a low-power mode. In some examples, retransmit information to the memory device based on receiving the second signal, where the second signal includes a parity signal.

The low power manager 925 may identify that the memory device is to enter to the low-power mode, where transmitting the third signal is based on identifying that the memory device is to enter to the low-power mode.

Figure 10:
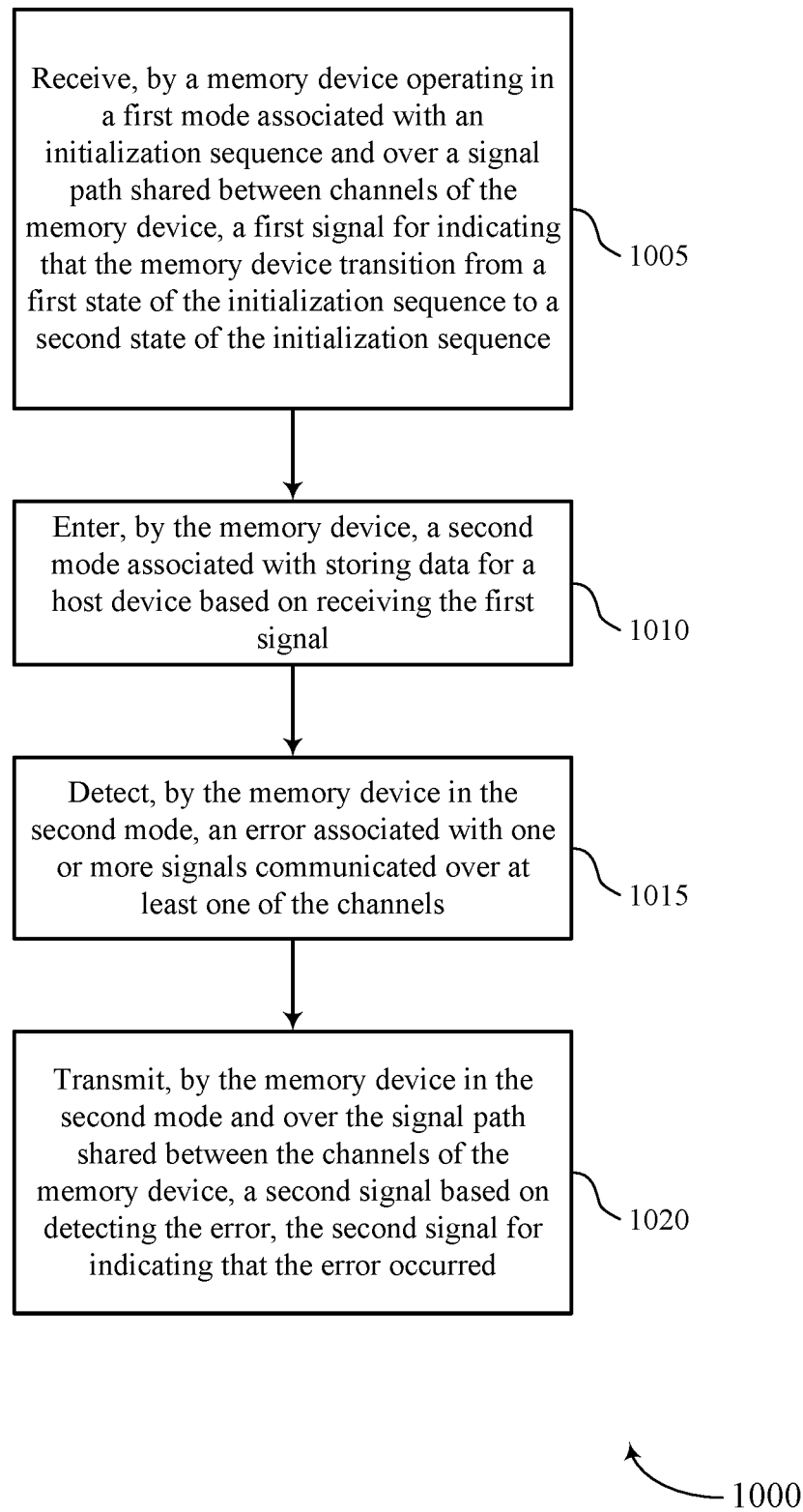
FIGS. 10 and 11 show flowcharts illustrating a method or methods that support multi-purpose signaling for a memory system in accordance with examples as disclosed herein.

FIG. 10 shows a flowchart illustrating a method or methods 1000 that supports multi-purpose signaling for a memory system in accordance with examples as disclosed herein. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may receive, by a memory device operating in a first mode associated with an initialization sequence and over a signal path shared between channels of the memory device, a first signal for indicating that the memory device transition from a first state of the initialization sequence to a second state of the initialization sequence. The operations of 1005 may be performed according to the methods described herein. In some examples, aspects of the operations of 1005 may be performed by an initialization manager as described with reference to FIG. 8.

At 1010, the memory device may enter, by the memory device, a second mode associated with storing data for a host device based on receiving the first signal. The operations of 1010 may be performed according to the methods described herein. In some examples, aspects of the operations of 1010 may be performed by a mode manager as described with reference to FIG. 8.

At 1015, the memory device may detect, by the memory device in the second mode, an error associated with one or more signals communicated over at least one of the channels. The operations of 1015 may be performed according to the methods described herein. In some examples, aspects of the operations of 1015 may be performed by an operation manager as described with reference to FIG. 8.

At 1020, the memory device may transmit, by the memory device in the second mode and over the signal path shared between the channels of the memory device, a second signal based on detecting the error, the second signal for indicating that the error occurred. The operations of 1020 may be performed according to the methods described herein. In some examples, aspects of the operations of 1020 may be performed by an operation manager as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for receiving, by a memory device operating in a first mode associated with an initialization sequence and over a signal path shared between channels of the memory device, a first signal for indicating that the memory device transition from a first state of the initialization sequence to a second state of the initialization sequence, entering, by the memory device, a second mode associated with storing data for a host device based on receiving the first signal, detecting, by the memory device in the second mode, an error associated with one or more signals communicated over at least one of the channels, and transmitting, by the memory device in the second mode and over the signal path shared between the channels of the memory device, a second signal based on detecting the error, the second signal for indicating that the error occurred.

Some examples of the method 1000 and the apparatus described herein may further include operations, features, means, or instructions for receiving, by the memory device operating in the second mode, a third signal over the signal path shared between the channels of the memory device, the third signal for indicating to the memory device to enter a third mode that may be a low-power mode. Some examples of the method 1000 and the apparatus described herein may further include operations, features, means, or instructions for entering, by the memory device, the third mode that may be the low-power mode based on receiving the third signal while operating in the second mode.

Some examples of the method 1000 and the apparatus described herein may further include operations, features, means, or instructions for prioritizing, by the memory device operating in the second mode, one or more operations associated with the third signal based on a collision between the second signal and the third signal occurring on the signal path. Some examples of the method 1000 and the apparatus described herein may further include operations, features, means, or instructions for identifying whether the memory device may be driving a signal over the signal path, where receiving the third signal may be based on whether the memory device may be driving the signal over the signal path.

In some examples of the method 1000 and the apparatus described herein, detecting the error further may include operations, features, means, or instructions for detecting the error associated with a signal communicated over a first channel of the channels or detecting the error associated with a signal communicated over a second channel of the channels, where transmitting the second signal may be based on detecting the error for the first channel or detecting the error for the second channel. In some examples of the method 1000 and the apparatus described herein, the second signal includes a parity signal.

Some examples of the method 1000 and the apparatus described herein may further include operations, features, means, or instructions for transitioning from the first state of the initialization sequence to the second state of the initialization sequence based on receiving the first signal, where entering the second mode may be based on transitioning from the first state to the second state, where the first state includes a final state of the initialization sequence. Some examples of the method 1000 and the apparatus described herein may further include operations, features, means, or instructions for identifying that the initialization sequence associated with the first mode may be complete, where entering the second mode may be based on identifying that the initialization sequence associated with the first mode may be complete.

Some examples of the method 1000 and the apparatus described herein may further include operations, features, means, or instructions for activating a pull-down transistor to transition a voltage of the signal path from a first voltage level to a second voltage level, where transmitting the second signal may be based on activating the pull-down transistor. In some examples of the method 1000 and the apparatus described herein, the signal path may be a high-terminated signal path, and the second voltage level may be less than the first voltage level.

In some examples of the method 1000 and the apparatus described herein, the first signal or the second signal may be modulated using a modulation scheme that includes three or more symbols. In some examples of the method 1000 and the apparatus described herein, the signal path may be shared between a first channel of the memory device and a second channel of the memory device, and the signal path may be operable to communicate two or more types of signals for either the first channel or the second channel.

In some examples of the method 1000 and the apparatus described herein, the first signal includes a clock signal for progressing the memory device through states of the initialization sequence. In some examples of the method 1000 and the apparatus described herein, the first state and the second state include a portion of a finite state machine associated with the initialization sequence. Some examples of the method 1000 and the apparatus described herein may further include operations, features, means, or instructions for transmitting, over one or more data signal paths of the first channel, a static pattern to indicate a current state of the memory device in the initialization sequence.

Figure 11:
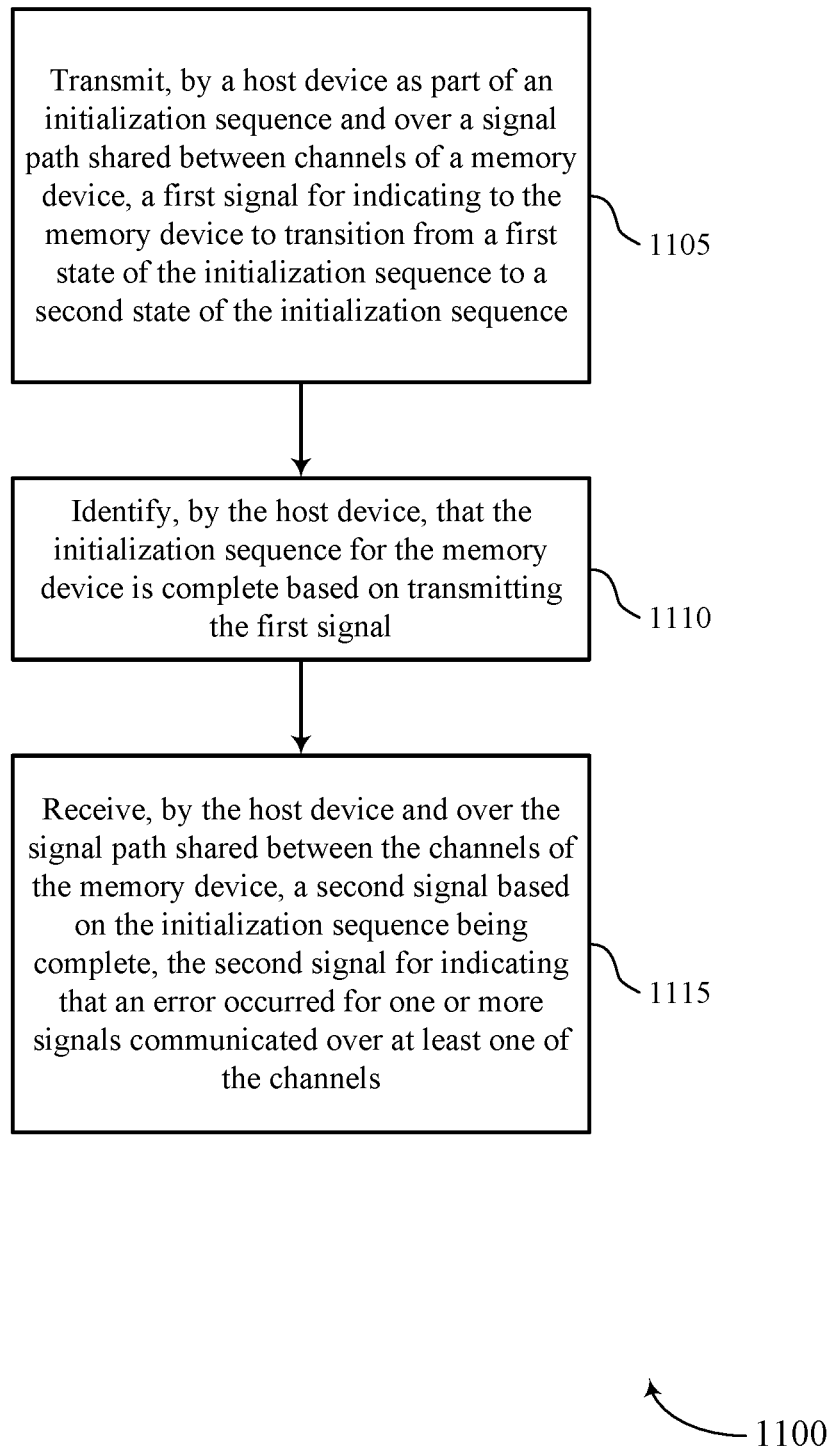

FIG. 11 shows a flowchart illustrating a method or methods 1100 that supports multi-purpose signaling for a memory system in accordance with examples as disclosed herein. The operations of method 1100 may be implemented by a host device or its components as described herein. For example, the operations of method 1100 may be performed by a host device as described with reference to FIG. 9. In some examples, a host device may execute a set of instructions to control the functional elements of the host device to perform the described functions. Additionally or alternatively, a host device may perform aspects of the described functions using special-purpose hardware.

At 1105, the host device may transmit, by a host device as part of an initialization sequence and over a signal path shared between channels of a memory device, a first signal for indicating to the memory device to transition from a first state of the initialization sequence to a second state of the initialization sequence. The operations of 1105 may be performed according to the methods described herein. In some examples, aspects of the operations of 1105 may be performed by an initialization manager as described with reference to FIG. 9.

At 1110, the host device may identify, by the host device, that the initialization sequence for the memory device is complete based on transmitting the first signal. The operations of 1110 may be performed according to the methods described herein. In some examples, aspects of the operations of 1110 may be performed by an initialization manager as described with reference to FIG. 9.

At 1115, the host device may receive, by the host device and over the signal path shared between the channels of the memory device, a second signal based on the initialization sequence being complete, the second signal for indicating that an error occurred for one or more signals communicated over at least one of the channels. The operations of 1115 may be performed according to the methods described herein. In some examples, aspects of the operations of 1115 may be performed by an operation manager as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for transmitting, by a host device as part of an initialization sequence and over a signal path shared between channels of a memory device, a first signal for indicating to the memory device to transition from a first state of the initialization sequence to a second state of the initialization sequence, identifying, by the host device, that the initialization sequence for the memory device is complete based on transmitting the first signal, and receiving, by the host device and over the signal path shared between the channels of the memory device, a second signal based on the initialization sequence being complete, the second signal for indicating that an error occurred for one or more signals communicated over at least one of the channels.

Some examples of the method 1100 and the apparatus described herein may further include operations, features, means, or instructions for transmitting, by the host device, a third signal over the signal path shared between the channels of the memory device, the third signal for indicating to the memory device to enter a low-power mode. Some examples of the method 1100 and the apparatus described herein may further include operations, features, means, or instructions for identifying that the memory device may be to enter to the low-power mode, where transmitting the third signal may be based on identifying that the memory device may be to enter to the low-power mode. Some examples of the method 1100 and the apparatus described herein may further include operations, features, means, or instructions for identifying that the memory device may be to transition states in the initialization sequence, where transmitting the first signal may be based on identifying that the memory device may be to transition the states in the initialization sequence.

In some examples of the method 1100 and the apparatus described herein, the first signal includes a clock signal for progressing the memory device through states of the initialization sequence. Some examples of the method 1100 and the apparatus described herein may further include operations, features, means, or instructions for retransmitting information to the memory device based on receiving the second signal, where the second signal includes a parity signal. Some examples of the method 1100 and the apparatus described herein may further include operations, features, means, or instructions for receiving, over one or more data signal paths of the first channel, a static pattern to indicate a current state of the memory device in the initialization sequence, and identifying the current state of the memory device in the initialization sequence based at least in part on receiving the static pattern.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells and an interface operable to couple the array of memory cells with a host device using a set of channels, the interface including a pin shared between a first channel and a second channel of the set of channels and operable to couple with a signal path, the pin for communicating a first type of signal associated with an initialization sequence during a first mode of operation and for indicating to transition from a first state of the initialization sequence to a second state of the initialization sequence and a second type of signal associated with storing or receiving data of the array of memory cells during a second mode of operation and for indicating that an error occurred with one or more signals communicated over the first channel or the second channel.

In some examples, the interface further may include operations, features, means, or instructions for a driver coupled with the pin and operable to transmit the second type of signal to the host device based on detecting that the error occurred. In some examples, the driver further may include operations, features, means, or instructions for a pull-down circuit including a transistor operable to selectively couple the pin with a voltage source based on a voltage being applied to a gate of the transistor. Some examples of the apparatus may include a control component coupled with the gate of the transistor and operable to receive a third signal from the first channel or a fourth signal from the second channel, where the control component outputs the voltage to the gate of the transistor based on receiving the third signal or the fourth signal.

In some examples, the interface may be further operable to communicate over the pin a third type of signal for indicating to the apparatus to enter a low-power mode. Some examples of the apparatus may include a control component operable to cause the apparatus to enter the low-power mode based on receiving the third type of signal. Some examples of the apparatus may include a control component operable cause the apparatus to perform one or more operations associated with the initialization sequence based on receiving the first type of signal.

Some examples of the apparatus may include a control component operable to detect the error associated with the one or more signals communicated over the first channel or the second channel and cause the apparatus to transmit the second type of signal based on detecting the error. In some examples, the interface further may include operations, features, means, or instructions for a receiver coupled with the pin and operable to detect the first type of signal communicated from the host device. In some examples, the interface communicates different types of signals over the pin during different modes of operation of the apparatus.

In some examples, the first channel further includes a first set of data signal paths operable to communicate data between the host device and a first portion of memory cells of the array of memory cells, and the second channel further includes a second set of data signal paths operable to communicate data between the host device and a second portion of memory cells of the array of memory cells different than the first portion of memory cells. In some examples, the first channel further may include operations, features, means, or instructions for one or more command/address signal paths for communicating command/address information for the first portion of memory cells, one or more error detection signal paths for communicating information about errors associated with the first portion of memory cells, and one or more clock signals paths for communicating one or more clock signals associated with the first portion of memory cells.

An apparatus is described. The apparatus may include a pin operable to couple with a signal path that is shared between channels of a memory device and a controller operable to transmit, as part of an initialization sequence and over the signal path, a first signal for indicating to the memory device to transition from a first state of the initialization sequence to a second state of the initialization sequence, identify that the initialization sequence for the memory device is complete based on transmitting the first signal, and receive a second signal over the signal path based on the initialization sequence being complete, the second signal for indicating that an error occurred for one or more signals communicated over at least one of the channels.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, by a memory device operating in a first mode associated with an initialization sequence and over a signal path shared between channels of the memory device, a first signal for indicating that the memory device transition from a first state of the initialization sequence to a second state of the initialization sequence;
   entering, by the memory device, a second mode associated with storing data for a host device based at least in part on receiving the first signal;
   detecting, by the memory device in the second mode, an error associated with one or more signals communicated over at least one of the channels; and
   transmitting, by the memory device in the second mode and over the signal path shared between the channels of the memory device, a second signal based at least in part on detecting the error, the second signal for indicating that the error occurred.

2. The method of claim 1, further comprising:
   receiving, by the memory device operating in the second mode, a third signal over the signal path shared between the channels of the memory device, the third signal for indicating to the memory device to enter a third mode that is a low-power mode.

3. The method of claim 2, further comprising:
   entering, by the memory device, the third mode that is the low-power mode based at least in part on receiving the third signal while operating in the second mode.

4. The method of claim 2, further comprising:
   prioritizing, by the memory device operating in the second mode, one or more operations associated with the third signal based at least in part on a collision between the second signal and the third signal occurring on the signal path.

5. The method of claim 2, further comprising:
   identifying whether the memory device is driving a signal over the signal path, wherein receiving the third signal is based at least in part on whether the memory device is driving the signal over the signal path.

6. The method of claim 1, wherein detecting the error further comprises:
   detecting the error associated with a signal communicated over a first channel of the channels or detecting the error associated with a signal communicated over a second channel of the channels, wherein transmitting the second signal is based at least in part on detecting the error for the first channel or detecting the error for the second channel.

7. The method of claim 1, further comprising:
transitioning from the first state of the initialization sequence to the second state of the initialization sequence based at least in part on receiving the first signal, wherein entering the second mode is based at least in part on transitioning from the first state to the second state, wherein the first state comprises a final state of the initialization sequence.

8. The method of claim 1, further comprising:
identifying that the initialization sequence associated with the first mode is complete, wherein entering the second mode is based at least in part on identifying that the initialization sequence associated with the first mode is complete.

9. The method of claim 1, further comprising:
activating a pull-down transistor to transition a voltage of the signal path from a first voltage level to a second voltage level, wherein transmitting the second signal is based at least in part on activating the pull-down transistor, wherein the signal path is a high-terminated signal path and the second voltage level is less than the first voltage level.

10. The method of claim 1, wherein the first signal or the second signal are modulated using a modulation scheme that includes three or more symbols.

11. A method, comprising:
transmitting, by a host device as part of an initialization sequence and over a signal path shared between channels of a memory device, a first signal for indicating to the memory device to transition from a first state of the initialization sequence to a second state of the initialization sequence;
identifying, by the host device, that the initialization sequence for the memory device is complete based at least in part on transmitting the first signal; and
receiving, by the host device and over the signal path shared between the channels of the memory device, a second signal based at least in part on the initialization sequence being complete, the second signal for indicating that an error occurred for one or more signals communicated over at least one of the channels.

12. The method of claim 11, further comprising:
transmitting, by the host device, a third signal over the signal path shared between the channels of the memory device, the third signal for indicating to the memory device to enter a low-power mode.

13. The method of claim 12, further comprising:
identifying that the memory device is to enter to the low-power mode, wherein transmitting the third signal is based at least in part on identifying that the memory device is to enter to the low-power mode.

14. The method of claim 11, further comprising:
identifying that the memory device is to transition states in the initialization sequence, wherein transmitting the first signal is based at least in part on identifying that the memory device is to transition the states in the initialization sequence.

15. The method of claim 11, wherein the first signal comprises a clock signal for progressing the memory device through states of the initialization sequence.

16. The method of claim 11, further comprising:
retransmitting information to the memory device based at least in part on receiving the second signal, wherein the second signal comprises a parity signal.

17. The method of claim 11, further comprising:
receiving, over one or more data signal paths of the channels, a static pattern to indicate a current state of the memory device in the initialization sequence; and
identifying the current state of the memory device in the initialization sequence based at least in part on receiving the static pattern.

18. An apparatus, comprising:
an array of memory cells;
an interface operable to couple the array of memory cells with a host device using a plurality of channels, the interface comprising a pin shared between a first channel and a second channel of the plurality of channels and operable to couple with a signal path, the pin for communicating;
a first type of signal associated with an initialization sequence during a first mode of operation and for indicating to transition from a first state of the initialization sequence to a second state of the initialization sequence; and
a second type of signal associated with storing or receiving data of the array of memory cells during a second mode of operation and for indicating that an error occurred with one or more signals communicated over the first channel or the second channel.

19. The apparatus of claim 18, wherein the interface further comprises a driver coupled with the pin and operable to transmit the second type of signal to the host device based at least in part on detecting that the error occurred.

20. The apparatus of claim 19, wherein the driver further comprises a pull-down circuit comprising a transistor operable to selectively couple the pin with a voltage source based at least in part on a voltage being applied to a gate of the transistor.

21. The apparatus of claim 20, further comprising:
a control component coupled with the gate of the transistor and operable to receive a third signal from the first channel or a fourth signal from the second channel, wherein the control component outputs the voltage to the gate of the transistor based at least in part on receiving the third signal or the fourth signal.

22. The apparatus of claim 18, wherein the interface is further operable to communicate over the pin a third type of signal for indicating to the apparatus to enter a low-power mode.

23. The apparatus of claim 22, further comprising:
a control component operable to cause the apparatus to:
enter the low-power mode based at least in part on receiving the third type of signal; and
perform one or more operations associated with the initialization sequence based at least in part on receiving the first type of signal.

24. The apparatus of claim 18, further comprising:
a control component operable to detect the error associated with the one or more signals communicated over the first channel or the second channel and cause the apparatus to transmit the second type of signal based at least in part on detecting the error.

25. The apparatus of claim 18, wherein the interface communicates different types of signals over the pin during different modes of operation of the apparatus.

* * * * *